United States Patent
Cho

(10) Patent No.: US 9,391,215 B2
(45) Date of Patent: Jul. 12, 2016

(54) DEVICE FOR GENERATING PHOTOVOLTAIC POWER AND METHOD FOR MANUFACTURING SAME

(75) Inventor: Ho Gun Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 608 days.

(21) Appl. No.: 13/813,248

(22) PCT Filed: Apr. 27, 2011

(86) PCT No.: PCT/KR2011/003124
§ 371 (c)(1),
(2), (4) Date: Apr. 1, 2013

(87) PCT Pub. No.: WO2012/015150
PCT Pub. Date: Feb. 2, 2012

(65) Prior Publication Data
US 2013/0180566 A1 Jul. 18, 2013

(30) Foreign Application Priority Data
Jul. 30, 2010 (KR) ................... 10-2010-0074417

(51) Int. Cl.
*H01L 31/0465* (2014.01)
*H01L 31/02* (2006.01)
*H01L 31/0224* (2006.01)

(52) U.S. Cl.
CPC .. *H01L 31/02021* (2013.01); *H01L 31/022425* (2013.01); *H01L 31/0465* (2014.12); *Y02E 10/50* (2013.01)

(58) Field of Classification Search
CPC ................. H01L 31/022425; H01L 31/02021; H01L 31/0465

USPC ....................................................... 136/256
See application file for complete search history.

(56) References Cited

U.S. PATENT DOCUMENTS

| | | | |
|---|---|---|---|
| 5,593,901 A | 1/1997 | Oswald et al. | |
| 2004/0261834 A1* | 12/2004 | Basore | H01L 31/022425 136/244 |
| 2009/0145472 A1 | 6/2009 | Li | |
| 2009/0178707 A1 | 7/2009 | Moon et al. | |

(Continued)

FOREIGN PATENT DOCUMENTS

| | | |
|---|---|---|
| CN | 101459183 A | 6/2009 |
| JP | 60-35553 | 2/1985 |

(Continued)

OTHER PUBLICATIONS

Supplementary European Search Report dated Nov. 4, 2013 in European Application No. 11812681.2, filed Apr. 27, 2011.

(Continued)

*Primary Examiner* — Janye Mershon
(74) *Attorney, Agent, or Firm* — Saliwanchik, Lloyd & Eisenchenk

(57) ABSTRACT

Disclosed are a solar cell apparatus and a method of fabricating the same. The solar cell apparatus includes a substrate; a first cell on the substrate; a second cell adjacent to the first cell; a first insulating film covering the first and second cells; and a connection member connecting the first cell with the second cell. The first insulating film includes a first via hole for exposing the first cell and a second via hole for exposing the second cell, and the connection member connects the first cell with the second cell through the first and second via holes.

13 Claims, 4 Drawing Sheets

(56) References Cited

U.S. PATENT DOCUMENTS

| | | |
|---|---|---|
| 2009/0188550 A1 | 7/2009 | Moon et al. |
| 2009/0199894 A1* | 8/2009 | Hollars ................. H01L 31/048 136/251 |
| 2011/0120545 A1* | 5/2011 | Auman ............... C08G 73/1067 136/256 |
| 2011/0126886 A1* | 6/2011 | Stangl ................ H01L 27/1423 136/249 |

FOREIGN PATENT DOCUMENTS

| | | | |
|---|---|---|---|
| JP | 04-116986 | | 4/1992 |
| JP | 8-18082 | | 1/1996 |
| JP | 2000-196116 A | | 7/2000 |
| JP | 2001-119043 A | | 4/2001 |
| JP | 2001-284617 A | | 10/2001 |
| JP | 2002-319686 A | | 10/2002 |
| JP | 2007-305876 A | | 11/2007 |
| JP | 2009-259926 A | | 11/2009 |
| KR | 10-1991-0007170 A | | 4/1991 |
| KR | 10-2007-0050597 A | | 5/2007 |
| KR | 10-2009-0077529 A | | 7/2009 |
| KR | 10-2009-0081864 A | | 7/2009 |
| WO | WO 2010/012259 | * | 2/2010 |

OTHER PUBLICATIONS

Office Action dated Dec. 31, 2014 in Chinese Application No. 2011-80037336.

International Search Report in International Application No. PCT/KR2011/003124, filed Apr. 27, 2011.

Notice of Allowance dated Jan. 17, 2012 in Korean Application No. 10-2010-0074417, filed Jul. 30, 2010.

Office Action dated Sep. 30, 2014 in Japanese Application No. 2013-521675.

* cited by examiner

DEVICE FOR GENERATING PHOTOVOLTAIC POWER AND METHOD FOR MANUFACTURING SAME

CROSS-REFERENCE TO RELATED APPLICATIONS

This application is the U.S. national stage application of International Patent Application No. PCT/KR2011/003124, filed Apr. 27, 2011, which claims priority to Korean Application No. 10-2010-0074417, filed Jul. 30, 2010, the disclosures of each of which are incorporated herein by reference in their entirety.

TECHNICAL FIELD

The embodiment relates to a solar cell apparatus and a method of fabricating the same.

BACKGROUND ART

Recently, as energy consumption is increased, a solar cell apparatus has been developed to convert solar energy into electric energy.

In particular, a CIGS-based solar cell apparatus, which is a PN hetero junction apparatus having a substrate structure including a glass substrate, a metallic back electrode layer, a P type CIGS-based light absorbing layer, a high-resistance buffer, and an N type window layer, has been extensively used.

In addition, studies and research have been performed to improve electric characteristics of the solar cell apparatus, such as the low resistance and high transmittance rate. Further, studies and research have been pursued to develop a flexible solar cell apparatus.

DISCLOSURE

Technical Problem

The embodiment provides a solar cell apparatus, which can be readily fabricated and has high reliability by preventing the disconnection, and a method of fabricating the same.

Technical Solution

A solar cell apparatus according to the embodiment includes a substrate; a first cell on the substrate; a second cell adjacent to the first cell; a first insulating film covering the first and second cells; and a connection member connecting the first cell with the second cell, wherein the first insulating film includes a first via hole for exposing the first cell and a second via hole for exposing the second cell, and the connection member connects the first cell with the second cell through the first and second via holes.

A solar cell apparatus according to the embodiment includes a substrate; a first cell on the substrate; a second cell adjacent to the first cell; a connection member connected to the first and second cells; and a plating layer coated on an outer surface of the connection member.

A method of fabricating a solar cell apparatus according to the embodiment includes the steps of forming first and second cells adjacent to each other on the substrate; forming a first insulating film having a first via hole for exposing the first cell and a second via hole for exposing the second cell; and forming a connection member connected to the first and second cells through the first and second via holes.

Advantageous Effects

According to the solar cell apparatus of the embodiment, adjacent cells are connected with each other by the connection member connected to the cells through the via hole formed in the insulating film. After the insulating film is disposed on the cells and via holes are formed in the insulating film to expose the cells, the connection member is printed corresponding to the via holes.

That is, since the connection member is formed through the printing scheme, the solar cell apparatus according to the embodiment can be readily fabricated.

In addition, in a state that the connection member has been printed, the connection member and the cells are subject to the electroplating process. Thus, the connection member can be securely connected to the cells and the solar cell apparatus according to the embodiment can prevent the disconnection.

Further, the connection strength between the connection member and the cells can be reinforced due to the plating layer and the solar cell apparatus according to the embodiment may have the improved electric characteristics.

Therefore, the solar cell apparatus according to the embodiment can be readily fabricated and may have the improved reliability.

BEST MODE

Figure 1:
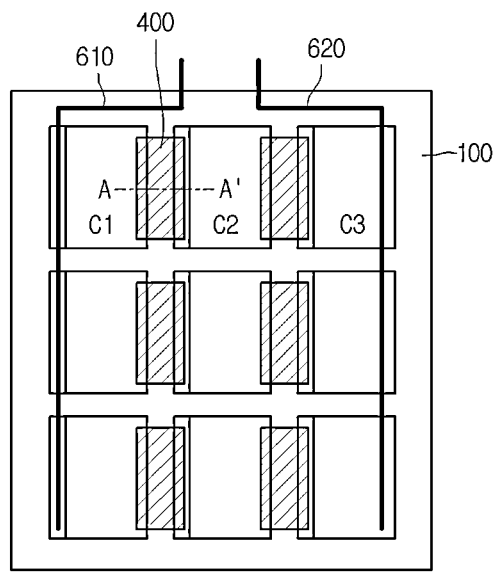
FIG. 1 is a plan view showing a solar cell panel according to the embodiment.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 2:
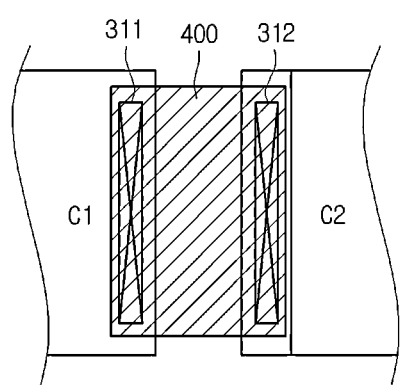
FIG. 2 is an enlarged plan view showing a connection state between first and second cells.
Figure 3:
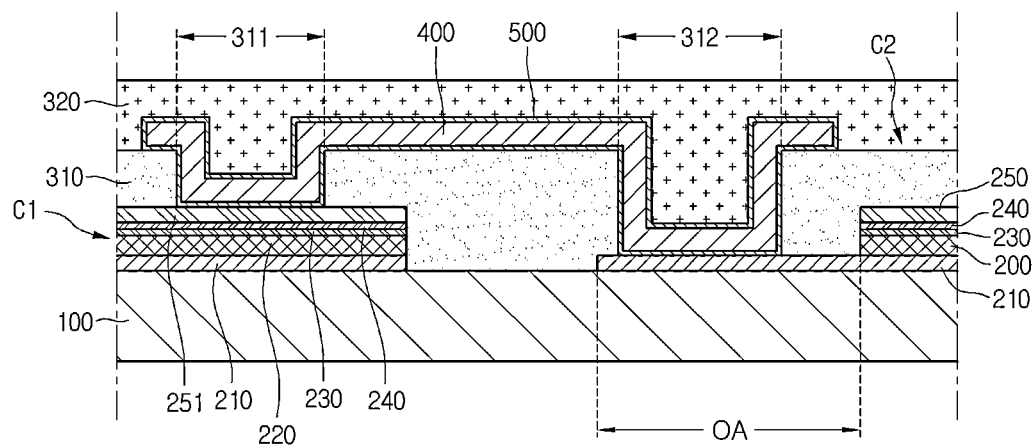
FIG. 3 is a sectional view taken along line A-A' of FIG. 1.

FIG. 1 is a plan view showing a solar cell panel according to the embodiment, FIG. 2 is an enlarged plan view showing a connection state between first and second cells C1 and C2, and FIG. 3 is a sectional view taken along line A-A' of FIG. 1.

Referring to FIGS. 1 to 3, the solar cell panel according to the embodiment includes a support substrate 100, a plurality of cells C1, C2 . . . and Cn, a first insulating film 310, a second insulating film 320, a plurality of connection members 400, a plating layer 500, a first bus bar 610 and a second bus bar 620.

The support substrate 10 supports the cells C1, C2 . . . and Cn, the first insulating film 310, the second insulating film 320, and the connection members 400. The support substrate 100 has a plate shape and is flexible.

The support substrate 100 may be an insulator. For instance, the support substrate 100 may be a stainless steel substrate or a polymer substrate including ethylenevinylacetate (EVA) or polyimide (PI).

The cells C1, C2 . . . and Cn are disposed on the support substrate 100. The cells C1, C2 . . . and Cn are spaced apart from each other in the form of a matrix. In addition, the cells C1, C2 . . . and Cn may extend in one direction and can be arranged in the form of a stripe.

The cells C1, C2 . . . and Cn are connected with each other in series or parallel. In detail, the cells C1, C2 . . . and Cn spaced apart from each other are connected with each other in series or parallel by the connection members 400, the first bus bar 610 and the second bus bar 620.

The cells C1, C2 . . . and Cn receive solar light to convert the solar light into electric energy. For instance, the cells C1, C2 . . . and Cn may include silicon solar cells, semiconductor compound solar cells, such as CIGS solar cells, or dye-sensitized solar cells.

Each of the cells C1, C2 . . . and Cn may include a back electrode 210, a light absorbing part 220, a buffer 230, a high-resistance buffer 240, and a window 250.

The back electrode 210 is provided on the support substrate 100. The back electrode 210 is a conductive layer. For instance, the back electrode 210 may include molybdenum (Mo).

The back electrode 210 has a relatively large area. That is, the back electrode 210 has an area larger than an area of the light absorbing part 220, the buffer 230, the high-resistance buffer 240 and the window 250.

Therefore, the top surface of the back electrode 210 is partially exposed. In detail, a part of the back electrode 210 laterally protrudes with respect to the lateral side of the light absorbing part 220.

The light absorbing part 220 is disposed on the back electrode 210. The light absorbing part 220 absorbs solar light incident through the window 250. For instance, the light absorbing part 220 may include group I-III-VI compounds. For instance, the light absorbing part 220 may include the $Cu(In,Ga)Se_2$ (CIGS) crystal structure, the $Cu(In)Se_2$ crystal structure, or the $Cu(Ga)Se_2$ crystal structure.

The light absorbing part 220 has an energy bandgap in the range of about 1 eV to about 1.8 eV.

The buffer 230 is disposed on the light absorbing part 220. The buffer 230 may include CdS and have an energy bandgap in the range of about 2.2 eV to 2.4 eV.

The high-resistance buffer 240 is disposed on the buffer 230. The high-resistance buffer 240 may include i-ZnO, which is not doped with impurities. The high-resistance buffer 240 may have an energy bandgap in the range of about 3.1 eV to about 3.3 eV.

The window 250 is formed on the high-resistance buffer 240. The window 250 is a transparent conductive layer. In addition, the window 250 has resistance higher than that of the back electrode 210. For instance, the resistance of the window 250 is ten times to two hundred time higher than the resistance of the back electrode 210.

The window 250 may include Al-doped zinc oxide (AZO) or Ga-doped zinc oxide (GZO). The window 250 may have a thickness in the range of about 800 nm to about 1200 nm.

The light absorbing part 220, the buffer 230, the high-resistance buffer 240 and the window 250 may have the substantially same area. At this time, the area of the light absorbing part 220, the buffer 230, the high-resistance buffer 240 and the window 250 may be smaller than the area of the back electrode 210.

Thus, the light absorbing part 220 may be laminated on the back electrode 210 in the form of a stair. That is, a step difference is formed between the light absorbing part 220 and the back electrode 210. The buffer 230, the high-resistance buffer 240 and the window 250 may not form the step difference with respect to the back electrode 210. That is, outer peripheral portions of the light absorbing part 220, the buffer 230, the high-resistance buffer 240 and the window 250 match with each other.

An opening area OA exposed through the light absorbing part 220 is formed in the back electrode 210. That is, the opening area OA is a region on the top surface of the back electrode 210 where the light absorbing part 220 is not disposed.

The first insulating film 310 is disposed on the support substrate 100. The first insulating film 310 covers the cells C1, C2 . . . and Cn. In detail, the first insulating film 310 is disposed on the cells C1, C2 . . . and Cn. The first insulating film 310 may cover the entire surface of the cells C1, C2 . . . and Cn. In addition, the first insulating film 310 may closely adhere to the cells C1, C2 . . . and Cn and the support substrate 100

The first insulating film 310 is a transparent insulator. The first insulating film 310 may include ethylenevinylacetate.

A plurality of first via holes 311 and second via holes 312 are formed in the first insulating film 310.

The first via holes 311 are formed through the first insulating film 310 and expose a part of the cells C1, C2 . . . and Cn. In detail, the first via holes 311 expose the top surface of the windows 250 of the cells C1, C2 . . . and Cn. The first via holes 311 are located corresponding to outer peripheral portions of the windows 250 of the cells C1, C2 . . . and Cn.

The second via holes 312 are formed through the first insulating film 310 and expose a remaining part of the cells C1, C2 . . . and Cn. In detail, the second via holes 312 expose the top surface of the back electrode 210 of the cells C1, C2 . . . and Cn. In more detail, the second via holes 312 are located corresponding to the opening area OA.

The second insulating film 320 is disposed on the first insulating film 310. The second insulating film 320 may cover the connection members 400, the first bus bar 610 and the second bus bar 620. The second insulating film 320 may cover an entire top surface of the first insulating film 310.

In addition, the second insulating film 320 may adhere to the first insulating film 310. The second insulating film 320 can seal the cells C1, C2 . . . and Cn, the connection members 400, the first bus bar 610 and the second bus bar 620 against the outside.

The second insulating film 320 is a transparent insulator. In addition, the second insulating film 320 is flexible and has high durability. In addition, the second insulating film 320 may be formed by using a material the same as that of the first insulating material. The second insulating film 320 may include ethylenevinylacetate, polyimide or polyethyleneterephthalate.

The connection members 400 are disposed among the cells C1, C2 . . . and Cn, respectively. In addition, the connection members 400 are disposed inside the first and second via holes 311 and 312 on the first insulating substrate.

The connection members 400 connect the cells C1, C2 . . . and Cn with each other. In detail, the connection members 400 connect the adjacent cells C1, C2 . . . and Cn with each other. That is, the connection members 400 connect the adjacent cells C1, C2 . . . and Cn with each other through the first and second via holes 311 and 312. In other words, the connection members 400 are connected to the cells C1, C2 . . . and Cn through the first and second via holes 311 and 312.

The connection members 400 connect the cells C1, C2 ... and Cn with each other in series. That is, the connection members 400 connect the window 250 of one cell to the back electrode 210 of the adjacent cell. The connection members 400 cover the first and second via holes 311 and 312. That is, one connection member 400 may simultaneously cover one first via hole 311 and one second via hole 312.

The connection members 400 are conductors. For instance, the connection members 400 may include conductive pastes or conductive tapes. In detail, the connection members 400 may include Ag pastes or copper plates.

The connection members 400 are flexible. That is, the connection members 400 may be curved as the support substrate 100 is bent.

The connection members 400 are connected to the cells C1, C2 ... and Cn through the first and second via holes 311 and 312. That is, some connection members 400 are disposed inside the first and second via holes 311 and 312 and connected to the cells C1, C2 ... and Cn.

For instance, as shown in FIGS. 1 to 3, one of the connection members 400 connects the first and second cells C1 and C2 with each other in series. The first and second cells C1 and C2 are disposed adjacent to each other. One of the first via holes 311 exposes a part of the window 250 of the first cell C1 and one of the second via holes 312 exposes a part of the top surface of the back electrode 211 of the second cell C2.

The connection member 400 is connected to the window 250 of the first cell C1 through the first via hole 311. At this time, the connection member 400 directly makes contact with the window 250 of the first cell C1.

In addition, the connection member 400 is connected to the open area OA of the back electrode 210 of the second cell C2 through the second via hole 312. At this time, the connection member 400 directly makes contact with the back electrode 210 of the second cell C2.

The plating layer 500 surrounds the connection members 400. In addition, the plating layer 500 is disposed on the windows 250 of the cells C1, C2 ... and Cn exposed through the first via holes 311. The plating layer 500 is disposed on the top surface of the back electrode 21 of the cells C1, C2 ... and Cn exposed through the second via holes 312. The plating layer 500 may be disposed between the connection members 400 and the window 250 of the cells C1, C2 ... and Cn. In addition, the plating layer 500 may be disposed between the connection members 400 and the back electrode 210 of the cells C1, C2 ... and Cn.

The connection members 400 can be connected to the window 250 and the back electrode 210 of the cells C1, C2 ... and Cn through the plating layer 500. In detail, the plating layer 500 is disposed between the connection members 400 and the window 250 of the cells C1, C2 ... and Cn to improve the electric and mechanical connection property between the connection members 400 and the window 250 of the cells C1, C2 ... and Cn. In the same manner, the plating layer 500 is disposed between the connection members 400 and the back electrode 210 of the cells C1, C2 ... and Cn to improve the electric and mechanical connection property between the connection members 400 and the back electrode 210 of the cells C1, C2 ... and Cn.

That is, the plating layer 500 is plated on the connection members 400, the window 250 of the cells C1, C2 ... and Cn and the back electrode 210 of the cells C1, C2 ... and Cn.

The plating layer 500 is a conductive layer and may include a metal having low resistance. The plating layer may include Cu, Ag or Au.

The first bus bar 610 connects the cells C1, C2 ... and Cn with each other in parallel. In detail, the first bus bar 610 is connected to the back electrode 210 of the cells C1, C2 ... and Cn disposed at the outer peripheral portion. The first bus bar 610 is disposed between the first insulating film 310 and the back electrode 210 of the cells C1, C2 ... and Cn. The first bus bar 610 may extend in one direction and is connected to the adjacent solar cell panel or the external electricity storage device.

The second bus bar 620 connects the cells C1, C2 ... and Cn with each other in parallel. In detail, the second bus bar 620 is connected to the window 250 of the cells C1, C2 ... and Cn disposed at the other outer peripheral portion. The second bus bar 620 is disposed between the first insulating film 310 and the window 250 of the cells C1, C2 ... and Cn. The second bus bar 620 may extend in one direction and is connected to the adjacent solar cell panel or the external electricity storage device.

The first and second bus bars 610 and 620 are conductors and can be formed by using Cu or Ag. The first and second bus bars 610 and 620 may be prepared in the form of the paste or the conductive tape.

The connection members 400 connect adjacent cells C1, C2 ... and Cn with each other through the first and second via holes 311 and 312. In particular, the connection members 400 are connected to the top surface of the window 250 and the top surface of the back electrode 210 of the cells C1, C2 ... and Cn. The connection members 400 can be formed by printing paste.

That is, since the connection members 400 are formed through the printing scheme, the solar cell apparatus according to the embodiment can be readily fabricated through the automation process.

In addition, after the connection members 400 have been printed, the plating layer 500 can be formed on the connection members 400 and the cells C1, C2 ... and Cn through the electroplating process. Thus, the connection members 400 can be securely connected to the cells C1, C2 ... and Cn and the solar cell panel according to the embodiment can prevent the disconnection.

In addition, the connection strength between the connection members 400 and the cells C1, C2 ... and Cn can be improved due to the plating layer, so the solar cell panel according to the embodiment may have the improved electric and mechanical characteristics.

Thus, the solar cell panel according to the embodiment can be readily fabricated and can improve the reliability.

FIGS. 4 to 9 are sectional views showing the method of fabricating the solar cell panel according to the embodiment. The above description about the solar cell panel will be basically incorporated in the description about the method of fabricating the solar cell.

Figure 4:
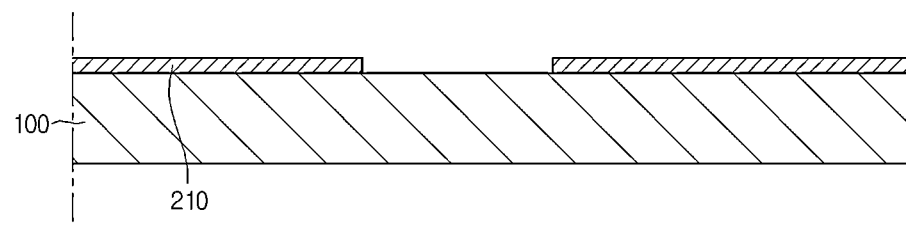
FIGS. 4 to 9 are sectional views showing a method of fabricating a solar cell apparatus according to the embodiment

Referring to FIG. 4, a plurality of back electrodes 210 are formed on the support substrate 100.

In order to form the back electrodes 210, a back electrode layer is formed on the support substrate 100. The back electrode layer can be formed by depositing Mo on the support substrate 100 through the vacuum deposition process, such as the sputtering process.

Then, the back electrode layer is patterned by a laser, so that the back electrode layer is divided into the back electrodes 210.

Figure 5:
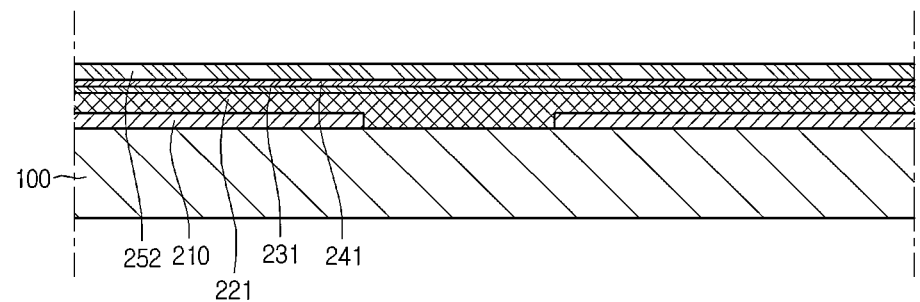

Referring to FIG. 5, a light absorbing layer 221, a buffer layer 231, a high-resistance buffer layer 241 and a window layer 252 are formed on the back electrodes.

The light absorbing layer 221 can be formed through the sputtering scheme or the evaporation scheme.

For instance, the light absorbing layer 221 may be formed through various schemes such as a scheme of forming a Cu(In,Ga)Se$_2$ (CIGS) based light absorbing layer 221 by simultaneously or separately evaporating Cu, In, Ga, and Se and a scheme of performing a selenization process after a metallic precursor layer has been formed Regarding the details of the selenization process after the formation of the metallic precursor layer, the metallic precursor layer is formed on the back electrodes 210 through a sputtering process employing a Cu target, an In target, or a Ga target.

Thereafter, the metallic precursor layer is subject to the selenization process so that the Cu (In, Ga) Se$_e$ (CIGS) based light absorbing layer 221 is formed.

In addition, the sputtering process employing the Cu target, the In target, and the Ga target and the selenization process may be simultaneously performed.

Further, a CIS or a CIG based light absorbing layer may be formed through the sputtering process employing only Cu and In targets or only Cu and Ga targets and the selenization process.

Then, CdS is deposited through the sputtering process or the chemical bath deposition (CBD) process to form the buffer layer 231.

After that, ZnO is deposited on the buffer layer 231 through the sputtering process to form the high-resistance buffer layer 241.

The buffer layer 231 and the high-resistance buffer layer 241 may have the shallow thickness. For instance, the buffer layer 231 and the high-resistance buffer layer 241 may have the thickness in the range of about 1 nm to about 80 nm.

Then, a transparent conductive material is deposited on the high-resistance buffer layer 241 to form the window layer 252. For instance, the window layer 252 can be formed by depositing Al-doped zinc oxide (AZO) on the high-resistance buffer layer 241 through the sputtering process.

Figure 6:
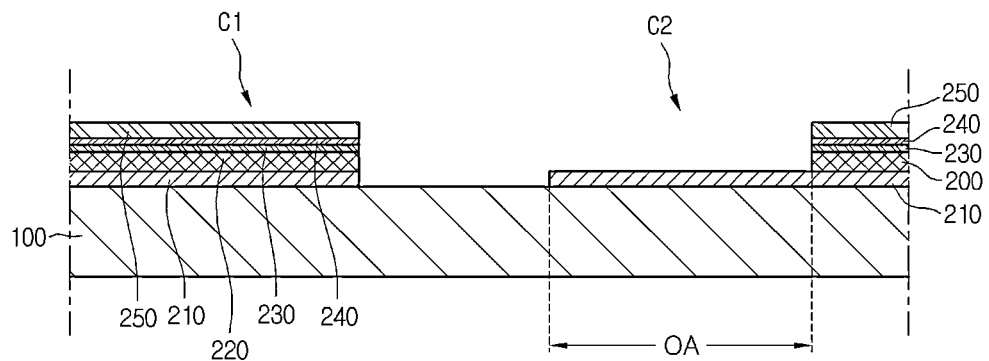

Referring to FIG. 6, the light absorbing layer 221, the buffer layer 231, the high-resistance buffer layer 241, and the window layer 252 are patterned through the laser or the mechanical scribing. In detail, the light absorbing layer 221, the buffer layer 231, the high-resistance buffer layer 241, and the window layer 252 are simultaneously patterned. As a result, a plurality of light absorbing parts 220, a plurality of buffers 230, a plurality of high-resistance buffers 240 and a plurality of windows 250 are formed.

Thus, a plurality of cells C1, C2 . . . and Cn including the back electrode 210, the light absorbing part 220, the buffer 230, the high-resistance buffer 240 and the window 250 are formed on the support substrate 100.

The light absorbing layer 221, the buffer layer 231, the high-resistance buffer layer 241, and the window layer 252 are patterned such that the top surface of the back electrode layers 210 can be partially exposed. Thus, the open area is formed in the top surface of the back electrodes 210.

Therefore, the back electrodes 210 and the light absorbing parts 220 are laminated in the shape of a stair.

Figure 7:
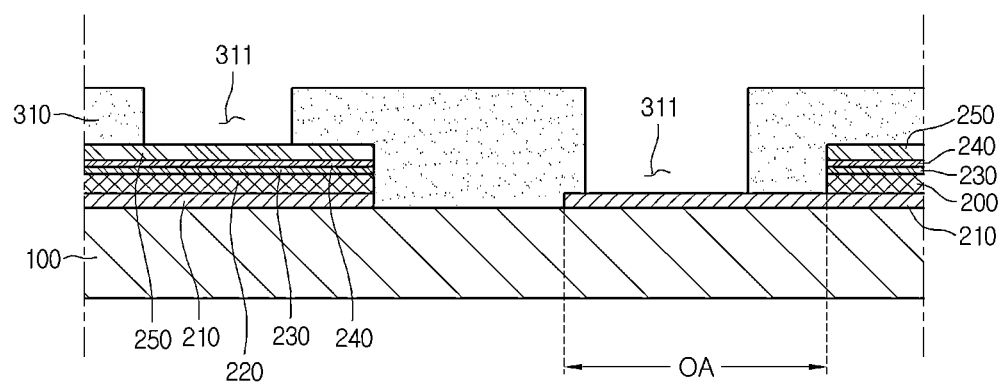

Referring to FIG. 7, the first insulating film 310 is formed on the cells C1, C2 . . . and Cn. That is, the first insulating film 310 is combined onto the support substrate 100 having the cells C1, C2 . . . and Cn. After that, a plurality of first via holes 311 and second via holes 311 and 312 are formed in the first insulating film 310.

The first via holes 311 expose the top surfaces of the windows 250 and the second via holes 312 expose the open areas OA of the back electrodes 210.

Figure 8:
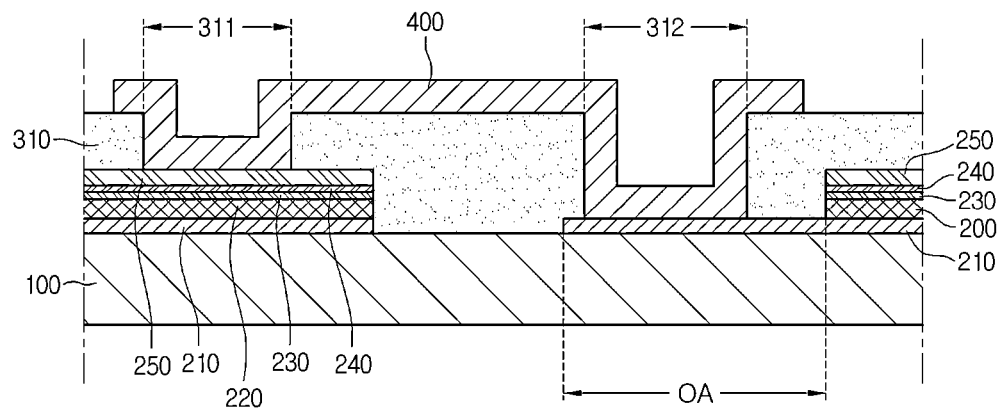

Referring to FIG. 8, a plurality of connection members 400 are formed on the first insulating film 310. The connection members 400 are formed through the printing scheme, such as the silk screen printing.

That is, conductive paste including conductive particles, such as metal particles, can be printed among the cells C1, C2 . . . and Cn. In addition, the conductive paste may be printed such that the first and second via holes 311 and 312 can be covered with the conductive paste. Thus, the connection members 400 can be formed.

After that, the connection members 400 can be subject to the drying process or the heat treatment process.

Figure 9:
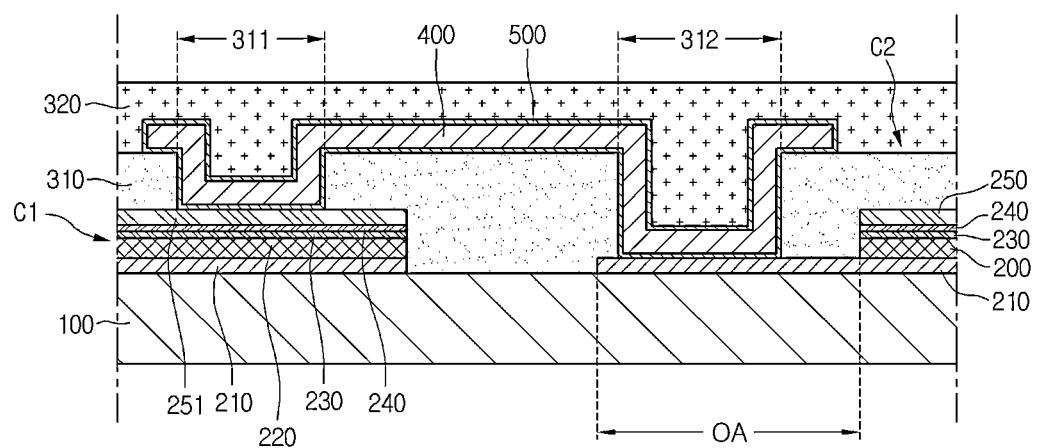

Referring to FIG. 9, the plating layer 500 is formed and then the second insulating film 320 is formed on the first insulating film 310.

The plating layer 500 can be formed through the electroplating process. For instance, a negative electrode is connected to the connection member 400 so that metallic ions, such as copper ions included in an electrolyte, can be plated on the connection members 400, the exposed windows 250 and the exposed back electrodes 210.

The connection members 400 may not completely adhere to the back electrodes 210 and the windows 250. That is, some connection members 400 may directly make contact with the back electrodes 210 and the windows 250, but remaining connection members 400 may be spaced apart from the back electrodes 210 and the windows 250 while forming a predetermined space therebetween.

At this time, the plating layer 500 is formed on the connection members 400, the top surfaces of the back electrodes 210 and the top surfaces of the windows 250 through the electroplating process. In addition, the plating layer 500 is formed in the predetermined space between the connection members 400 and the back electrode layers 210 and between the connection members 400 and the windows 250.

That is, the metallic ions contained in the electrolyte can be plated in the predetermined space between the connection members 400 and the windows 250 and between the connection members 400 and the back electrode layers 210.

Thus, the plating layer 500 may improve the electric and mechanical characteristics between the connection members 400 and the windows 250 and between the connection members 400 and the back electrode layers 210.

As described above, according to the solar cell panel of the embodiment, the connection members 400 can be formed at a time through the printing scheme. In addition, the solar cell panel according to the embodiment may have the improved characteristics due to the plating layer 500.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The solar cell apparatus and the method of fabricating the same according to the embodiment can be applied in the field of solar light generation.

The invention claimed is:

1. A solar cell apparatus comprising:
a substrate;
a first cell on the substrate;
a second cell adjacent to the first cell;
a first insulating film covering the first and second cells; and
a connection member connecting the first cell with the second cell,
wherein the first insulating film includes a first via hole for exposing the first cell and a second via hole for exposing the second cell, and
the connection member connects the first cell with the second cell through the first and second via holes,
wherein the first cell comprises:
a first back electrode on the substrates;
a first light absorbing part on the first back electrode; and
a first window on the first light absorbing part,
wherein the second cell comprises:
a second back electrode on the substrate;
a second light absorbing part on the second back electrode; and
a second window on the second light absorbing part, and
wherein the first via hole exposes a top surface of the first window of the first cell,
the second via hole exposes a top surface of the second back electrode of the second cell, and
the connection member connects the first window the second back electrode.

2. The solar cell apparatus of claim 1, further comprising a second insulating film covering the connection member on the first insulating film.

3. The solar cell apparatus of claim 1, wherein the connection member directly makes contact with top surfaces of the first window and the second back electrode.

4. The solar cell apparatus of claim 3, wherein the second light absorbing part is laminated in a shape of a stair such that the top surface of the second back electrode is exposed.

5. The solar cell apparatus of claim 1, further comprising a plating layer formed between the connection member and the first cell and between the connection member and the second cell.

6. The solar cell apparatus of claim 1, wherein the substrate and the connection member are flexible.

7. The solar cell apparatus of claim 1, wherein the connection member is disposed inside the first and second via holes and the first insulating substrate.

8. The solar cell apparatus of claim 1, wherein the connection member includes a conductor.

9. The solar cell apparatus of claim 1, wherein the connection member includes conductive pastes or conductive tapes.

10. The solar cell apparatus of claim 1, wherein the connection member includes Ag pastes or copper plates.

11. The solar cell apparatus of claim 1, wherein the connection member connects the first and second cells with each other in series.

12. The solar cell apparatus of claim 5, wherein the plating layer includes a conductive layer.

13. The solar cell apparatus of claim 5, wherein the plating layer includes metal.

* * * * *